United States Patent
Suzuki et al.

(10) Patent No.: US 9,595,723 B2
(45) Date of Patent: Mar. 14, 2017

(54) FUEL CELL SEPARATOR

(71) Applicant: KOBE STEEL, LTD., Kobe-shi (JP)

(72) Inventors: Jun Suzuki, Kobe (JP); Toshiki Sato, Kobe (JP); Satoru Takada, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 106 days.

(21) Appl. No.: 14/407,221

(22) PCT Filed: Jul. 1, 2013

(86) PCT No.: PCT/JP2013/068074
§ 371 (c)(1),
(2) Date: Dec. 11, 2014

(87) PCT Pub. No.: WO2014/013859
PCT Pub. Date: Jan. 23, 2014

(65) Prior Publication Data
US 2015/0171434 A1    Jun. 18, 2015

(30) Foreign Application Priority Data

Jul. 20, 2012  (JP) ................................ 2012-161256

(51) Int. Cl.
*H01M 8/0228*    (2016.01)
*H01M 8/0206*    (2016.01)
(Continued)

(52) U.S. Cl.
CPC ........ *H01M 8/0228* (2013.01); *B05D 3/0254* (2013.01); *B05D 7/14* (2013.01);
(Continued)

(58) Field of Classification Search
None
See application file for complete search history.

(56) References Cited

U.S. PATENT DOCUMENTS 6,440,598 B1    8/2002  Fukui et al.
2004/0170881 A1    9/2004  Nakata
(Continued)

FOREIGN PATENT DOCUMENTS

EP    2 597 711 A1    5/2013
JP    3904690    4/2007
(Continued)

OTHER PUBLICATIONS

JP 2012/043775 Jan. 3, 2012 English translation obtained from JPO website.*

(Continued)

*Primary Examiner* — Sarah A Slifka
(74) *Attorney, Agent, or Firm* — Oblon, McClelland, Maier & Neustadt, L.L.P.

(57) ABSTRACT

A fuel cell separator (10) which comprises a base (1) constituted of titanium or a titanium alloy and a conductive carbon layer (2) that was formed by press-bonding a carbon powder to the base (1) and that covers the surface thereof; an interlayer (3) having been formed between the base (1) and the carbon layer (2). The interlayer (3) has been formed by a heat treatment in an atmosphere containing a slight amount of oxygen, contains titanium carbide yielded by the reaction of the Ti of the base (1) with the C of the carbon layer (2), and has an oxygen content of 0.1-40 at %.

11 Claims, 4 Drawing Sheets

(51) Int. Cl.
| | |
|---|---|
| H01M 8/0213 | (2016.01) |
| H01M 8/0215 | (2016.01) |
| H01M 8/02 | (2016.01) |
| C22C 14/00 | (2006.01) |
| C22F 1/02 | (2006.01) |
| B05D 3/02 | (2006.01) |
| B05D 7/14 | (2006.01) |
| C22F 1/18 | (2006.01) |
| C23C 16/02 | (2006.01) |
| C23C 16/26 | (2006.01) |
| C23C 24/08 | (2006.01) |
| H01M 8/10 | (2016.01) |

(52) U.S. Cl.
CPC ............... *C22C 14/00* (2013.01); *C22F 1/02* (2013.01); *C22F 1/183* (2013.01); *C23C 16/0272* (2013.01); *C23C 16/26* (2013.01); *C23C 24/082* (2013.01); *H01M 8/0206* (2013.01); *H01M 8/0213* (2013.01); *H01M 8/0215* (2013.01); *H01M 2008/1095* (2013.01); *Y02E 60/50* (2013.01)

(56) References Cited

U.S. PATENT DOCUMENTS

| | | |
|---|---|---|
| 2008/0160390 A1 | 7/2008 | Nakata |
| 2010/0035120 A1 | 2/2010 | Sato et al. |
| 2010/0233587 A1 | 9/2010 | Sato et al. |
| 2012/0171468 A1 | 7/2012 | Tanaka et al. |
| 2013/0130153 A1 | 5/2013 | Suzuki et al. |
| 2013/0164654 A1 | 6/2013 | Suzuki et al. |

FOREIGN PATENT DOCUMENTS

| | | | |
|---|---|---|---|
| JP | 3904696 | | 4/2007 |
| JP | 2007-207718 | | 8/2007 |
| JP | 2008-204876 | | 9/2008 |
| JP | 4147925 | | 9/2008 |
| JP | 2009-238438 | A | 10/2009 |
| JP | 2012-28046 | A | 2/2012 |
| JP | 2012-28047 | A | 2/2012 |
| JP | 4886885 | | 2/2012 |
| JP | 2012-43775 | A | 3/2012 |
| JP | 2012-43776 | A | 3/2012 |
| WO | 2012/011201 | * | 1/2012 |

OTHER PUBLICATIONS

International Search Report issued Aug. 6, 2013 in PCT/JP2013/068074 filed Jul. 1, 2013.

Written Opinion of the International Searching Authority issued Aug. 6, 2013 in PCT/JP2013/068074 filed Jul. 1, 2013.

\* cited by examiner

FUEL CELL SEPARATOR

TECHNICAL FIELD

The present invention relates to fuel cell separators that are used in fuel cells and include titanium as a substrate.

BACKGROUND ART

Fuel cells can continuously generate electric power by continuous supply of a fuel such as hydrogen and an oxidizing agent such as oxygen thereto. Unlike primary batteries such as dry batteries and secondary batteries such as lead storage batteries, the fuel cells each generate electric power at high generation efficiency without being significantly affected by the scale of a relevant system. In addition, the fuel cells are less noisy and less cause vibration. The fuel cells are therefore promising as energy sources covering a variety of applications and scales. Specifically, the fuel cells have been developed in forms of polymer electrolyte fuel cells (PEFCs), alkaline fuel cells (AFCs), phosphoric acid fuel cells (PAFCs), molten carbonate fuel cells (MCFCs), solid oxide fuel cells (SOFCs), and biofuel cells. In particular, the polymer electrolyte fuel cells have been developed for use in fuel cell vehicles, domestic cogeneration systems, and mobile devices such as mobile phones and personal computers.

Such a polymer electrolyte fuel cell is hereinafter also simply referred to as a "fuel cell". The fuel cell includes a plurality of unit cells, each unit cell including an anode, a cathode, and a polymer electrolyte membrane disposed between the anode and the cathode, where the unit cells are stacked together with separators therebetween. The separators have grooves as flow channels for a gas such as hydrogen or oxygen. Such separators are also called bipolar plates.

The separator also acts as a component that leads a generated current from the fuel cell to the outside. A material having a low contact resistance is therefore used for the separator, where the contact resistance refers to a voltage drop due to an interfacial phenomenon between the electrode and the separator surface. In addition, the separator also requires high corrosion resistance, because the inside of the fuel cell is in an acidic atmosphere at a pH of about 2 to about 4. The separator also requires certain durability to maintain the above-described low contact resistance over a long duration during use in such acidic atmosphere. Thus, there have been used carbon separators that are milled from graphite powder compacts, or molded from a mixture of graphite and a resin. The carbon separators, however, are inferior in strength and toughness and may be broken when vibration or an impact is applied to the fuel cell. Hence, investigations have been made on separators made of metal materials having excellent workability and high strength, such as aluminum, titanium, nickel, alloys based on these metals, and stainless steels.

When a metal material such as aluminum or stainless steel is used for the separator, the material is corroded due to the inside acidic atmosphere of the fuel cell. This results in elution of metal ions, leading to early degradation of a polymer electrolyte membrane and a catalyst. In contrast, when a metal having high corrosion resistance, such as titanium, is used, a passive film is formed in a corrosive environment. The separator in this case has inferior (increased) contact resistance, because the passive film has low conductivity. Under these circumstances, there has been developed a separator including a substrate made of a metal material and a coating over the surface of the substrate, where the coating has certain conductivity that can be maintained over a long duration so as to add high corrosion resistance and high conductivity to the substrate.

Materials for the coating having high conductivity and still high corrosion resistance include noble metals such as Au and Pt or alloys of such noble metals. However, a separator, if coated with such a noble metal material, suffers from high cost. In a previously disclosed technology of a separator, a coating containing a carbon material is used as an inexpensive material having certain conductivity and corrosion resistance. The coating is disposed over the metallic substrate. Typically, each of separators disclosed in Patent literature (PTL) 1 and PTL 2 includes a substrate and carbon particles dispersed over the substrate. The substrate is composed of an austenite or austenite/ferrite duplex stainless steel being combined with Cr and Ni and having particularly high acid resistance among stainless steels, and the carbon particles are applied and brought into intimate contact with the substrate surface by compression bonding (PTL 1) or heat treatment (PTL 2).

In these separators, however, the carbon particles adhere to the substrate in islands, and the substrate is partially exposed. Even if the substrate is composed of the stainless steel having high acid resistance, iron ions may be eluted during use in a fuel cell. To prevent this, previously-developed separators employ highly corrosion-resistant titanium as a substrate. These separators are free from the risk of corrosion of the substrate regardless of environmental barrier properties of a conductive coating on the surface.

Independently, PTL 3 discloses a separator that is prepared by depositing a carbon film on a substrate at a high temperature through chemical vapor deposition (CVD) or sputtering to cover the substrate surface. The resulting carbon film becomes amorphous, has higher conductivity, and allows the separator to have low contact resistance. PTL 4 discloses a separator that includes a metal substrate, a conductive thin film disposed over the substrate surface and including carbon, and an intermediate layer disposed between the substrate and the conductive thin film. The metal substrate bears an oxide layer that is allowed to remain for better corrosion resistance. The intermediate layer is disposed so as to offer adhesion between the oxide layer and the conductive thin film and includes a metal element selected from elements such as Ti, Zr, Hf, Nb, Ta, and Cr, or a metalloid element such as Si. In addition, the separator has a gradient mixing ratio of the metal or metalloid element to carbon from the intermediate layer to the conductive thin film at an interface between them. PTL 5 discloses a separator that includes a metal substrate, a diamond-like carbon layer over the substrate, and a conductive section over the diamond-like carbon layer. The conductive section includes graphite particles dispersed and disposed over the diamond-like carbon layer. The diamond-like carbon layer and the conductive section are formed with an arc ion plating (AIP) apparatus so as to impart corrosion resistance to the substrate.

The separators disclosed in PTL 3 to 5 each have an amorphous carbon film deposited by CVD or sputtering, thereby have insufficient barrier properties, suffer from deterioration in conductivity though the substrate being protected by the passive film from corrosion, and have insufficient adhesion between the carbon film and its underlying layer (the metal substrate or intermediate layer). In addition, the process such as CVD requires a long time to deposit the carbon film to a sufficient thickness. Thus, the separators are inferior in productivity.

Under these circumstances, some of the inventors have developed a separator including a titanium substrate, a carbon layer over the substrate, and an intermediate layer between the substrate and the carbon layer. The intermediate layer includes titanium carbide and is formed by a heat treatment after forming the carbon layer over the substrate (see PTL 6). The intermediate layer formed in the above manner by a reaction between titanium of the substrate and carbon of the carbon layer provides excellent adhesion between the carbon layer and the substrate. In addition, conductive titanium carbide formed in the intermediate layer allows the separator to have low resistance.

CITATION LIST

Patent Literature

PTL 1: Japanese Patent No. 3904690
PTL 2: Japanese Patent No. 3904696
PTL 3: Japanese Unexamined Patent Application Publication (JP-A) No. 2007-207718
PTL 4: Japanese Patent No. 4147925
PTL 5: JP-A No. 2008-204876
PTL 6: Japanese Patent No. 4886885

SUMMARY OF INVENTION

Technical Problem

Of such separators, a separator to be disposed to face an anode (fuel electrode) of the fuel cell is exposed to a hydrogen gas ($H_2$) atmosphere at a high temperature. Disadvantageously, a metal material constituting the separator absorbs hydrogen and causes deterioration (embrittlement) in mechanical properties of the separator. Among metal materials, titanium and titanium alloys relatively readily absorb hydrogen. The separators disclosed in 1 to 6 have insufficient shielding properties against hydrogen regardless of whether employing an amorphous or graphite carbon film. The intermediate layer of the separator disclosed in PTL 6 has still insufficient shielding properties against hydrogen and is susceptible to improvements.

The present invention has been made in consideration of these problems. An object of the present invention is to provide a fuel cell separator that includes a highly corrosion resistant and lightweight titanium substrate and an inexpensive carbon film over the substrate with good adhesion. The fuel cell separator can maintain its conductivity, has good corrosion resistance, satisfactorily resists hydrogen absorption (significantly less absorbs hydrogen), and can be used as a separator facing an anode (fuel electrode) in a fuel cell.

Solution to Problem

The inventors focused attention on the fact that a titanium oxide resists hydrogen absorption and thought of allowing an intermediate layer to contain not only titanium carbide, but also oxygen, where the intermediate layer is disposed between a titanium substrate and a carbon layer as in the separator disclosed in PTL 6. Based on this, the inventors made further intensive investigations and found a specific oxygen content to allow the intermediate layer to have both conductivity and resistance to hydrogen absorption.

Specifically, the present invention provides a fuel cell separator that includes a substrate including titanium or a titanium alloy, a conductive carbon layer over the substrate, and an intermediate layer between the substrate and the carbon layer. The intermediate layer contains titanium carbide and has an oxygen content of 0.1 to 40 atomic percent. The carbon layer in the fuel cell separator preferably includes graphite. The intermediate layer in the fuel cell separator preferably has an oxygen content of 0.5 to 30 atomic percent.

As described above, the intermediate layer is disposed between the substrate and the carbon layer and includes titanium carbide that is derived from both the substrate and the carbon layer. The presence of the intermediate layer allows the separator to have good adhesion between the substrate and the carbon layer and imparts barrier properties to the substrate. In addition, the intermediate layer contains oxygen in a predetermined content and thereby has resistance to hydrogen absorption in addition to conductivity. This protects the substrate from hydrogen embrittlement and allows the separator to act as a fuel cell separator having excellent durability. In a preferred embodiment, the carbon layer includes crystalline graphite. The fuel cell separator in this embodiment can have still better conductivity and can maintain the conductivity over a long duration even in an inside environment of a fuel cell.

Advantageous Effects of Invention

The fuel cell separator according to the present invention has excellent corrosion resistance, can maintain low contact resistance over a long duration by the action of an inexpensive carbon film, and can be used as a separator facing an anode (fuel electrode) of a fuel cell.

DESCRIPTION OF EMBODIMENTS

Fuel Cell Separator

Figure 1:
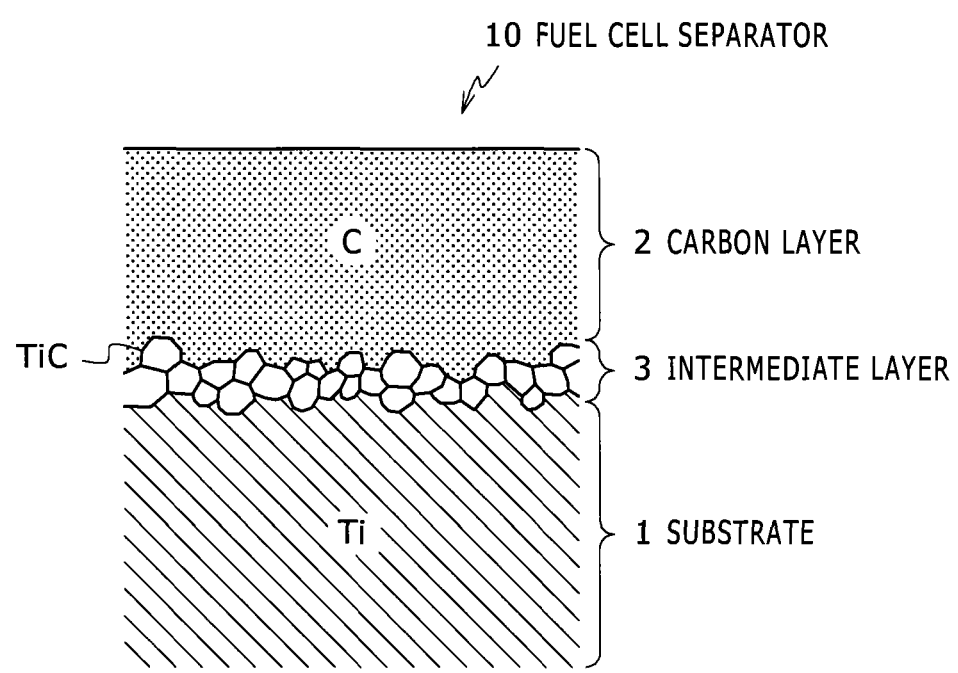
FIG. 1 is a schematic, enlarged cross-sectional view of a multilayer structure of a fuel cell separator according to an embodiment of the present invention.

A fuel cell separator according to an embodiment of the present invention will be illustrated in detail with reference to FIG. 1.

The fuel cell separator 10 according to an embodiment of the present invention is a plate-like separator for use in common fuel cells (polymer electrolyte fuel cells) and includes grooves (not shown) that act as channels for a gas such as hydrogen or oxygen. As illustrated in FIG. 1, the fuel cell separator 10 includes a substrate 1, a carbon layer 2, and an intermediate layer 3. The substrate 1 includes titanium (pure titanium) or a titanium alloy. The carbon layer 2 defines a surface of the fuel cell separator 10. The intermediate layer 3 is disposed between the substrate 1 and the carbon layer 2. As used herein the term "surface" of the fuel cell separator 10 refers to a region (including both sides and end faces) that is exposed to an inside atmosphere of a fuel cell upon use of the separator in the fuel cell. Each component constituting the fuel cell separator will be illustrated in detail below.

Substrate

The substrate 1 is prepared by shaping a plate material into a shape of the fuel cell separator 10 so as to act as a substrate of the fuel cell separator 10. The substrate 1 includes titanium (pure titanium) or a titanium alloy. The titanium or titanium allow is preferred particularly for reduction in thickness and weight of the fuel cell separator and, upon the use of the fuel cell separator 10 in a fuel cell, exhibits sufficient acid resistance against the inside acidic atmosphere of the fuel cell. Typically, pure titanium prescribed in Japanese Industrial Standard (JIS) H 4600 Class 1 to Class 4, or titanium alloys such as Ti—Al, Ti—Ta, Ti-6Al-4V, and Ti—Pd can be used herein. Among them, pure titanium is suitable for reduction in thickness and is preferably usable herein. Especially, pure titanium, as a preferred material, contains O in a content of 1500 ppm or less (more preferably 1000 ppm or less), Fe in a content of 1500 ppm or less (more preferably 1000 ppm or less), C in a content of 800 ppm or less, N in a content of 300 ppm or less, and H in a content of 130 ppm or less, with the remainder consisting of titanium (Pi) and inevitable impurities. For example, a cold rolled sheet of JIS Class 1 is preferably used The pure titanium is preferred as the titanium material (matrix), because the material can easily undergo cold rolling, specifically, can undergo cold rolling to a total rolling reduction of 35% or more without process annealing, and can surely offer good press formability after cold rolling. However, pure titanium or a titanium alloy usable in the present invention is not limited thereto, and a material containing other metal elements may be preferably used as long as the material has a chemical composition substantially corresponding to that of the above-described pure titanium or titanium alloy. Such titanium and carbon as components or elements are hereinafter also respectively indicated as "Ti" and "C".

The substrate 1 may have a thickness (sheet thickness) not critical, but preferably from 0.05 to 1.0 mm as a substrate of a fuel cell separator. The substrate 1, when having a thickness within such a range, allows the fuel cell separator 10 to meet requirements of reduction in weight and thickness, still has satisfactory strength and handleability as a sheet material, and can be easily shaped (rolled) into a sheet material having a thickness within the range. In this case, the substrate 1 can be relatively easily processed into a shape of the fuel cell separator 10 after the formation of the carbon layer 2.

In a production method according to an embodiment, the substrate 1 may be produced in the form of a sheet (strip) from the titanium or a titanium alloy by a known process including the steps of casting, hot rolling, and cold rolling to a desired thickness, and annealing and acid washing between the steps as necessary. The substrate 1 is preferably finished by annealing after cold rolling. However, the substrate 1 may be finished in any form. Typically, the substrate 1 may be subjected to acid wash after the annealing, or may be finished by any treatment such as vacuum heat treatment or bright annealing.

Carbon Layer

The carbon layer 2 is disposed over the substrate 1, defines or constitutes the surface of the fuel cell separator 10, and imparts conductivity in a corrosive environment to the fuel cell separator 10. The carbon layer 2 is not limited in the structure, as long as including carbon (C) with corrosion resistance and having conductivity, but preferably has a hexagonal crystal graphite structure. Specifically, the carbon layer 2 preferably includes hexagonal sheet-like crystals including a stack of a multiplicity of graphene sheets. The crystalline graphite has excellent conductivity, exhibits satisfactory durability in the high-temperature and acidic atmosphere of the inside environment of a fuel cell, and can maintain the conductivity. The carbon layer 2 including the graphite may be formed by applying a carbon powder to the substrate, followed by compression bonding. The carbon powder herein is shaped in the form of a granule or powder and is exemplified by graphite and carbon black. The process will be illustrated in detail in the method for producing the fuel cell separator below. Alternatively, the carbon layer 2 may have an amorphous structure including both a fine graphite structure and a cubic diamond structure, as with so-called charcoal The fuel cell separator 10 has better conductivity with an increasing area percentage of coverage of the carbon layer 2 in the entire surface (including both sides and end faces) to be exposed to the inside atmosphere of the fuel cell. Accordingly, the carbon layer 2 most preferably covers the entire surface, but may be present in an area percentage of 40% or more, and preferably 50% or more, of the entire surface. In the fuel cell separator 10 according to the embodiment of the present invention, the substrate 1 forms a passive film in a corrosive environment, thereby has, in itself, corrosion resistance and resistance to hydrogen absorption, and resists corrosion and embrittlement even when exposed from the surface, as described above. For this reason, the carbon layer 2 does not have to be a completely continuous film, but can be formed by applying and compression-bonding the carbon powder to the substrate, where the carbon powder has been shaped into a granule or powder as mentioned above. The carbon layer 2, when formed by the method, can have a sufficient thickness with good productivity and attains excellent conductivity derived from the graphite or carbon black The carbon layer 2 may have a thickness (layer thickness) not critical, but, if having an extremely small thickness, may fail to have sufficient conductivity. The carbon layer 2 as such a thin film includes the carbon powder in a small amount per area, i.e., in a low number density upon forming, thereby has many crevices to fail to exhibit sufficient barrier properties. The substrate 1 is exposed from such fine crevice regions in the surface and forms a passive film in the regions. This causes the fuel cell separator 10 to have further inferior conductivity. To impart sufficient conductivity to the fuel cell separator 10, the carbon layer 2 may be present in a coating mass of carbon of preferably 2 $\mu g/cm^2$ or more, and more preferably 5 $\mu g/cm^2$ or more. In contrast, the carbon layer 2, if having a coating mass of carbon of greater than 1 $mg/cm^2$, may fail to have still better conductivity and may hardly be formed from a large amount of the carbon powder by compression bonding. In addition, such an extremely thick carbon layer 2 may be readily peeled off typically in an after-mentioned heat treatment. This is caused by the difference in coefficient of thermal expansion between the carbon layer 2 and the substrate 1. To prevent these, the carbon layer 2 preferably has a coating mass of carbon of 1 $mg/cm^2$ or less. The thickness and coating mass of carbon of the carbon layer 2 may be controlled by the coating mass of the carbon powder applied to the substrate 1 to form the carbon layer 2.

Intermediate Layer

The intermediate layer 3 is formed by, after forming the carbon layer 2 over the substrate 1, allowing carbon and titanium to diffuse into each other at the interface between the carbon layer 2 and the substrate 1. The intermediate layer 3 further contains oxygen (O) in a content of 0.1 to 40 atomic percent. The intermediate layer 3 includes at least part of the titanium and carbon as titanium carbide (TiC). Thus, in the intermediate layer 3, carbon of the carbon layer 2 and titanium of the substrate react with each other to form titanium carbide. This allows the carbon layer 2 and the substrate 1 to be firmly bonded to each other through the intermediate layer 3. In addition, the intermediate layer 3, as containing titanium carbide, has conductivity and allows the carbon layer 2 and the substrate 1 to be connected to each other with low electric resistance.

Assume that the intermediate layer 3 contains titanium and carbon alone as chemical compositions. In this case, the intermediate layer 3 may fail to offer sufficient shielding properties, and this may cause the substrate 1 (titanium matrix) to absorb incoming hydrogen and to become brittle. To prevent this, the intermediate layer 3 contains oxygen in a content of 0.1 atomic percent or more. With an increasing oxygen content, the intermediate layer 3 has increasing resistance to hydrogen absorption. For this reason, the intermediate layer 3 has an oxygen content of preferably 0.3 atomic percent or more, more preferably 0.5 atomic percent or more, and furthermore preferably 0.8 atomic percent or more. In contrast, with an increasing oxygen content, the intermediate layer 3 has a composition being near to titanium dioxide ($TiO_2$) which is insulating, thereby has lower conductivity, and fails to allow the separator to have sufficient conductivity as a fuel cell separator. To prevent this, the intermediate layer 3 has an oxygen content of 40 atomic percent or less, preferably 35 atomic percent or less, more preferably 30 atomic percent or less, and furthermore preferably 26 atomic percent or less. The intermediate layer 3 having an oxygen content within the range may be formed by performing a heat treatment in an atmosphere containing a trace amount of oxygen gas ($O_2$) after forming the carbon layer 2 over the substrate 1. This process will be illustrated in detail below in the method for producing the fuel cell separator.

The presence of the intermediate layer 3, namely, the presence of titanium carbide in a region at the interface between the substrate 1 and the carbon layer 2 means that the substrate 1 bears no insulating passive film (titanium dioxide, $TiO_2$) in the region at the surface. When the carbon layer 2 is formed by compression-bonding of a carbon powder onto the substrate 1 as described above, the carbon layer 2 at this time point is attached to the hard substrate 1 merely by compression and thereby has insufficient adhesion to the substrate 1. In this state, there is present a passive film (oxide layer) at a surface of the substrate 1, namely, at the interface between the substrate 1 and the carbon layer 2, regardless of the finishing of the substrate 1 (whether acid wash is applied). The article in this state, when subjected to a heat treatment in a low-oxygen atmosphere containing oxygen at a predetermined level or less, the passive film at the surface of the substrate 1 may be thinned and can be lost ultimately. This is probably because oxygen (O) in the passive film ($TiO_2$) diffuses inward into the matrix (Ti) of the substrate 1 and/or reacts with carbon of the carbon layer 2 to be discharged as carbon dioxide ($CO_2$). Then, the carbon layer 2 becomes into contact with the matrix (Ti) of the substrate 1 at an interface, carbon and titanium diffuse and react with each other at the interface by the heat treatment to form titanium carbide. The intermediate layer 3, as formed by the heat treatment after the formation of the carbon layer 2 in the above manner, includes titanium carbide (TiC) as granules as illustrated in FIG. 1. In an embodiment, such titanium carbide granules are present successively along the interface between the substrate 1 and the carbon layer 2 to form a layer having a thickness corresponding to one granule, or two or more granules. In the intermediate layer 3, all titanium and carbon do not have to form titanium carbide. The intermediate layer 3 further contains oxygen. The intermediate layer 3 can therefore further contain, in combination with titanium carbide, an oxygen-deficient titanium oxide and/or metal titanium including solute carbon and/or solute oxygen.

A region where the intermediate layer 3 (titanium carbide) is formed is therefore a region where the passive film of the substrate 1 is lost. In such region, the carbon layer 2 covers the substrate 1 (matrix) through the conductive intermediate layer 3 alone and is connected to the substrate 1 with low electric resistance, as described above. The resulting fuel cell separator 10 acts as a multilayer structure of the substrate 1, the intermediate layer 3, and the carbon layer 2 and can offer low contact resistance. In addition, the intermediate layer 3, as formed, allows the substrate 1 and the carbon layer 2 to be firmly bonded with each other through the intermediate layer 3. Upon the shaping into the fuel cell separator 10 or upon use in a fuel cell, the fuel cell separator 10 is protected from not only peeling of the carbon layer 2, but also the formation of a gap between the substrate 1 and the carbon layer 2. This prevents the inside acidic atmosphere of the fuel cell from coming into the separator and coming into contact with the substrate 1 surface and from forming a new passive film. The fuel cell separator 10 thereby has better durability with suppression of increase in contact resistance. In addition, the intermediate layer 3, or the passive film in a region where the carbon layer 2 is not present prevents the inside hydrogen gas atmosphere of the fuel cell from coming into the fuel cell separator 10 and coming into contact with the substrate 1 surface. This impedes hydrogen absorption by the substrate 1 (matrix) and allows the fuel cell separator 10 to have better durability.

The intermediate layer 3 is most preferably present at the entire interface between the substrate 1 and the carbon layer 2, but may preferably be present 50% or more of the interface so as to offer sufficient adhesion between the substrate 1 and the carbon layer 2. The intermediate layer 3 may have a thickness not critical, but preferably 10 nm or more to offer sufficient adhesion between the substrate 1 and the carbon layer 2. In contrast, the intermediate layer 3, if having a thickness greater than 500 nm, may fail to offer still better adhesion between the substrate 1 and the carbon layer 2 and may require a long heat treatment time, resulting in inferior productivity. To prevent this, the intermediate layer 3 may have a thickness of preferably 500 nm or less, and more preferably 200 nm or less.

Method for Producing Fuel Cell Separator

Next, an embodiment of a method for producing the fuel cell separator according to the present invention will be illustrated.

Substrate Producing Step

A cold-rolled sheet (strip) including titanium or a titanium alloy and having a desired thickness is produced according to a known process as described above, wound into a coil, and yields the substrate 1. Where necessary, the cold-rolled sheet may be further subjected to annealing and/or acid wash with a mixture of hydrofluoric acid and nitric add.

Carbon Layer Forming Step

A carbon powder is applied to a surface (one side or both sides) of the substrate 1 so as to form the carbon layer 2. The carbon powder may be applied to the substrate 1 by any process without limitation, but may be applied directly to the substrate. Alternatively, the carbon powder may be dispersed in an aqueous solution typically of carboxymethylcellulose, or in a coating material containing a resin component to give a slurry, and the slurry may be applied to the substrate 1. The process to form the carbon layer is further exemplified by a process of kneading the carbon powder with a resin to give a carbon-powder-containing film, and applying the film onto the substrate 1; a process of shot-blasting the carbon powder to the substrate 1 to be held by the substrate 1; and a process of mixing the carbon powder with a resin powder, and applying the mixture to the substrate 1 by cold spraying. When a solvent is used typically in the application of the slurry, the solvent is preferably evaporated typically by blowing before the subsequent compression bonding.

The carbon powder to form the carbon layer 2 preferably has a powder size or particle size of 0.5 to 100 μm. The carbon powder, if having an excessively large particle size, may be hardly applied to the substrate 1 especially by compression bonding by rolling. In contrast, the carbon powder, if having an excessively small particle size, may be pressed to the substrate 1 with a weaker force upon rolling compression bonding to the substrate 1 and may be hardly applied (attached) to the substrate 1.

The substrate 1 applied with the carbon powder is further subjected to cold rolling to press and bond the carbon powder to the substrate 1 to thereby bond particles of the carbon powder to each other and yields the carbon layer 2 in the form of a film. This compression bonding procedure is hereinafter also referred to as "rolling compression bonding". The cold rolling herein may be performed with a rolling mill as with regular cold rolling to produce the substrate 1, but does not require the application of a lubricating oil to a mill roll, because the carbon powder acts as with such lubricant. The rolling compression bonding is preferably performed to a total rolling reduction of 0.1% or more. The "total rolling reduction" herein refers to a rate of change in total thickness caused by the rolling compression bonding, where the total thickness is a total of the thicknesses of the substrate 1 and the carbon layer (applied carbon powder) before the rolling compression bonding. The rolling compression bonding deforms the soft carbon powder to be joined or bonded to each other to form the carbon layer 2 in the form of a film, and the film-form carbon layer 2 adheres to the substrate 1. The total rolling reduction is not limited in upper limit and may be adjusted so as to allow the substrate 1 to have a desired thickness with respect to the thickness of the substrate 1 upon the completion of the substrate producing step. However, the substrate 1, if subjected to rolling to an excessively large total rolling reduction, may be warped or waved. To prevent this, the substrate 1 is preferably subjected to rolling to a total rolling reduction of 50% or less. The total rolling reduction of the substrate refers to a rate of change in thickness of the substrate 1 caused by rolling compression bonding with respect to the thickness of the substrate 1 before the rolling compression bonding.

As described above, the carbon layer 2 is formed by compression bonding of the carbon powder. The soft carbon particles are joined or bonded with each other to form a monolithic film, but are applied to the hard substrate 1 merely by pressing. The carbon layer 2 immediately after formation has insufficient adhesion to the substrate 1. In addition, a passive film is present at the surface of the substrate 1, namely, at the interface with the carbon layer 2, and this causes the article in this stage to have high contact resistance as a whole. As a solution to these, a subsequent heat treatment is performed. The heat treatment causes the substrate 1 to lose the passive film at the surface and forms the intermediate layer 3 between the substrate 1 and the carbon layer 2.

Heat Treatment Step

The substrate 1 after the formation of the carbon layer 2 is subjected to a heat treatment in a low oxygen atmosphere to reduce the thickness of the passive film on the substrate 1 and to cause at least part of the passive film to be lost. This allows the carbon layer 2 to come in contact with the matrix (Ti) of the substrate 1 at an interface, forms titanium carbide at the interface, and forms the intermediate layer 3. The heat treatment is preferably performed at a temperature of 300° C. to 850° C. The heat treatment, if performed at an excessively low temperature, may fail to allow the reaction between titanium and carbon to proceed at the interface between the substrate 1 and the carbon layer 2 and may thereby fail to form the intermediate layer 3. In contrast, the heat treatment proceeds at a higher reaction rate at an elevating temperature. This can shorten the heat treatment time. The heat treatment time may be set within the range of 0.5 to 60 minutes according to the heat treatment temperature. In contrast, the heat treatment, if performed at an excessively high temperature, may cause phase transformation of titanium, and this may change the mechanical properties of the substrate 1.

The "low oxygen atmosphere" refers to an atmosphere of an inert gas such as nitrogen ($N_2$) or argon (Ar) combined with a trace amount of oxygen ($O_2$). Specifically, the low oxygen atmosphere may have an oxygen ($O_2$) content of preferably from 5 to 300 ppm, and more preferably from 10 to 100 ppm, while the $O_2$ content may vary depending typically on the heat treatment temperature and pressure. The heat treatment, if performed in a non-oxidizing atmosphere such as a vacuum atmosphere or an atmosphere including an inert gas alone, the intermediate layer 3 fails to include oxygen (O) and exhibits insufficient shielding properties against hydrogen. In contrast, with an increasing $O_2$ content in the heat treatment atmosphere, the intermediate layer 3 has an increasing oxygen content. Accordingly, if the atmosphere containing $O_2$ in an excessively high content (i.e., if the oxygen partial pressure is not sufficiently low), the intermediate layer 3 may have an excessively high oxygen content and have lower conductivity. In addition, such heat treatment may cause carbon of the carbon layer 2 to be oxidized and to be dissociated as carbon dioxide ($CO_2$), and this may cause the carbon layer 2 to have a smaller thickness. The intermediate layer 3 can include a sufficient amount of oxygen by the heat treatment even at a low $O_2$ content as described above. Thus, the $O_2$ content (oxygen partial pressure) is precisely adjusted within the narrow range to control the oxygen content in the intermediate layer 3.

The heat treatment can employ any heat treatment furnace such as electric furnace and gas furnace, as long as capable of performing the heat treatment at a temperature within the desired range and capable of adjusting the atmosphere. When a continuous heat treatment furnace is employed, the heat treatment can be performed on the substrate 1 bearing the formed carbon layer 2 as intact as a coiled strip. In contrast, when a batch heat treatment furnace is employed, the heat treatment may be performed after cutting the substrate 1 bearing the carbon layer 2 to such a length as to be housed in the furnace or to a predetermined shape to form the fuel cell separator 10.

Shaping Step

The substrate 1 bearing the formed carbon layer 2 and the intermediate layer 3 may be shaped or formed into a desired shape typically by cutting or press forming and yields the fuel cell separator 10. The shaping step may be performed prior to the heat treatment step. Specifically, the shaping step may be performed even before the formation of the intermediate layer 3, as long as the carbon layer 2 adheres to the substrate 1 typically by processing to such an extent as not to be peeled off. Instead of the rolling compression bonding, the carbon powder may be compression-bonded simultaneously with press forming of the substrate 1 so as to form the carbon layer 2.

The fuel cell separator according to the present invention may be produced not only by the production method, but also by another method. Typically, the intermediate layer 3 and the carbon layer 2 may be continuously deposited and laminated in this sequence over the substrate 1 typically by chemical vapor deposition (CVD) or sputtering. The intermediate layer 3 may be deposited by sputtering with titanium as a target (cathode) using an Ar atmosphere further containing a carbon-containing gas such as methane ($CH_4$) and a trace amount of oxygen ($O_2$). Subsequently, sputtering is performed while changing one or more of conditions such as the atmosphere and the applied voltage to deposit the carbon layer 2. The carbon layer 2, when deposited by CVD, is generally an amorphous film. This production method does not require the heat treatment to form the intermediate layer 3. The passive film at the surface of the substrate 1 may be removed typically by ion beam irradiation or by acid wash before the deposition of the intermediate layer 3.

The fuel cell separator according to the present invention has been described with reference to embodiments of the present invention. Hereinafter examples by which advantageous effects of the present invention are demonstrated will be illustrated with reference to comparative examples not meeting one or more conditions specified in the present invention. It should be noted, however, these examples and embodiments are never intended to limit the scope of the invention, and it will naturally be understood by those skilled in the art that various changes and modifications may be made based on the description and be included within the scope of the invention.

EXAMPLES

Preparation of Test Sample

Pure titanium of JIS Class 1 was used as a substrate material. This had a chemical composition including O in a content of 450 ppm, Fe in a content of 250 ppm, N in a content of 40 ppm, C in a content of 200 ppm, and H in a content of 30 ppm, with the remainder consisting of Ti and inevitable impurities. The pure titanium was subjected to steps including melting, casting, hot rolling, and cold rolling according to known procedures and yielded a strip having a thickness of 0.1 mm. The strip was cut and yielded a substrate having a size of 50 mm by 150 mm.

A carbon powder used was an expanded graphite powder (SNE-6G, supplied by SEC CARBON, Ltd.) having an average particle size of 7 μm and a purity of 99.9%. The graphite powder was dispersed in a 0.8 percent by mass aqueous carboxymethylcellulose solution and yielded a slurry having a concentration of the graphite powder of 8 percent by mass. The slurry was applied to both sides of the substrate (cold-rolling-finished pure titanium) to a coating mass of 200 μg/cm² (in terms of mass after drying) per each side using a bar coater #10, followed by drying. The substrate was subjected to roll-press forming under a load of 2.5 tons using a double rolling mill having a work roll diameter of 200 mm with mill rolls not coated with a lubricating oil. This was performed as cold rolling of one pass to a rolling reduction of 1.0% to form a carbon layer. The rolling reduction in this case corresponds to a total rolling reduction The substrate bearing the formed carbon layer was held in a vacuum heat treatment furnace at 700° C. for 2 minutes as a heat treatment. In the furnace, the pressure was adjusted to $1.0 \times 10^5$ Pa (atmospheric pressure) with an Ar atmosphere having an $O_2$ content given in Table 1. The substrate after the 2-minute heat treatment was gas-cooled in an Ar atmosphere until the substrate temperature became 100° C. or lower, and yielded a fuel cell separator test sample.

Structural Observation of Region between Substrate and Carbon Layer

The fuel cell separator test sample was cut out, and a cross section of the test sample was processed by an ion beam processing apparatus (Hitachi Focused Ion Beam System, FB-2100) to give an observation face. While observing with a transmission electron microscope (TEM; Hitachi Field Emission Electron Microscope, HF-2200) at 750000-fold magnification, an approximate region of the interface between the substrate and the carbon layer in the observation face was subjected to energy dispersive X-ray spectrometry (EDX) and electron diffraction analysis. Specifically, in the cross section of the test sample, a region including titanium alone and a region including carbon alone were respectively defined as a "substrate" and a "carbon layer", and a region (layer) present between the two regions was subjected to EDX and electron diffraction analysis at any three points to determine whether titanium carbide (TiC) is present. Thus, a compositional analysis was performed. Titanium carbide was identified based on the coordinate of nucleus, and a sample in which titanium carbide was observed at one or more points was evaluated as including titanium carbide and indicated with "○" in Table 1. The contents of titanium, carbon, and oxygen are indicated in Table 1 each as an average of the measurements at the three points.

Evaluations

Contact Resistance Evaluation

Figure 2:
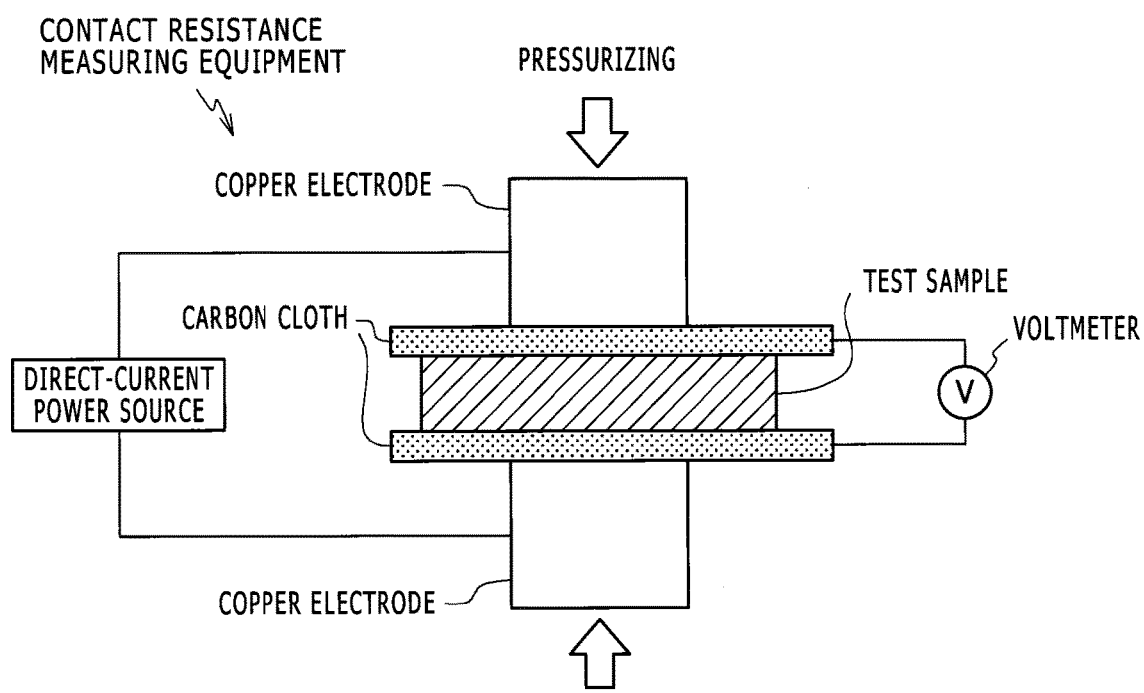
FIG. 2 is a schematic diagram illustrating how to measure a contact resistance.

Contact resistance of each test sample was measured using contact resistance measuring equipment illustrated in FIG. 2. The test sample was sandwiched between two carbon cloths, the outer sides of which were further sandwiched between two copper electrodes each having a contact area of 1 cm², and the test sample was pressurized from two sides with a load of 98 N (10 kgf). A current of 7.4 mA was then applied through the copper electrodes using a direct-current power source, and a voltage applied between the two carbon cloths was measured with a voltmeter to determine a resistance value. Table 1 indicates the resulting resistance values as values of initial contact resistance. A sample having a contact resistance of 10 mΩ·cm² or less was accepted herein for conductivity.

Durability Evaluation

Figure 3:
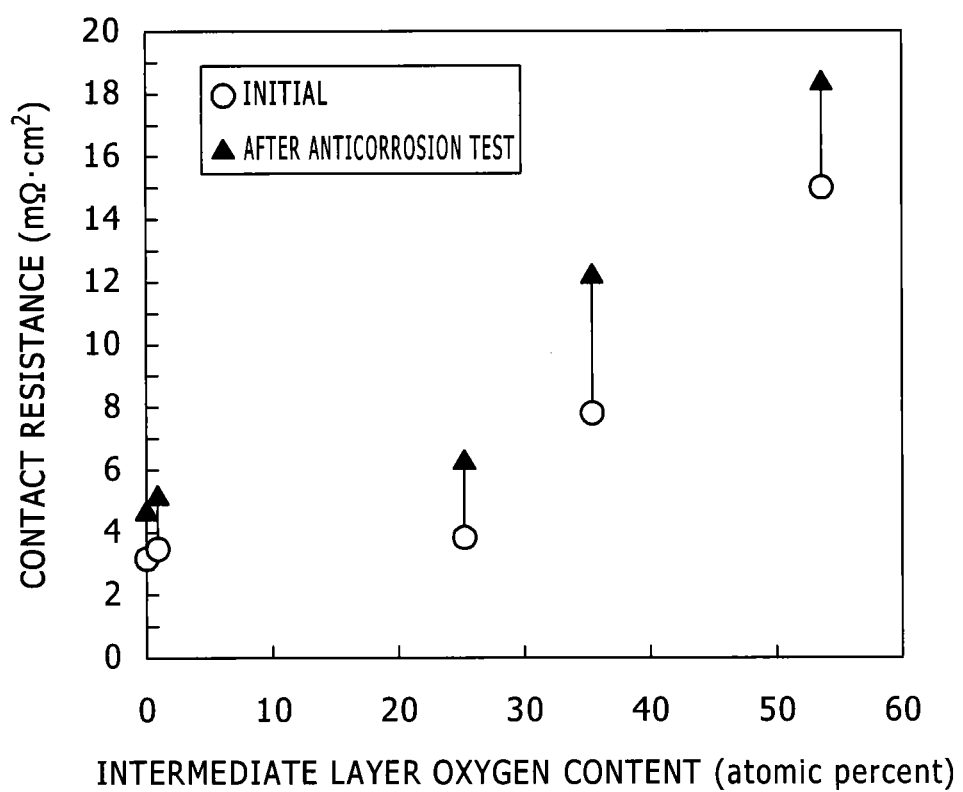
FIG. 3 is a graph illustrating how the contact resistance values of fuel cell separator test samples vary depending on the oxygen content in the intermediate layer, where the test samples were obtained in experimental examples.

Each test sample was subjected to an anticorrosion test. The test sample was first immersed in an aqueous sulfuric acid solution (10 mmol/L) having a solution volume to test sample area ratio of 20 ml/cm² at 80° C. Electric potential of +0.60 V was then applied to the test sample for 100 hours with a saturated calomel electrode (SCE) as a reference electrode. After the anticorrosion test, the test sample was washed and dried, and contact resistance thereof was measured by the same procedure as for the test specimen before immersion. Table 1 indicates the resulting contact resistance values. FIG. 3 depicts a graph illustrating how the contact resistance values before and after the immersion vary depending on the oxygen content in the intermediate layer.

A sample having a contact resistance of 15 mΩ·cm² or less after the anticorrosion test was accepted herein for durability.

Evaluation of Resistance to Hydrogen Absorption

Figure 4:
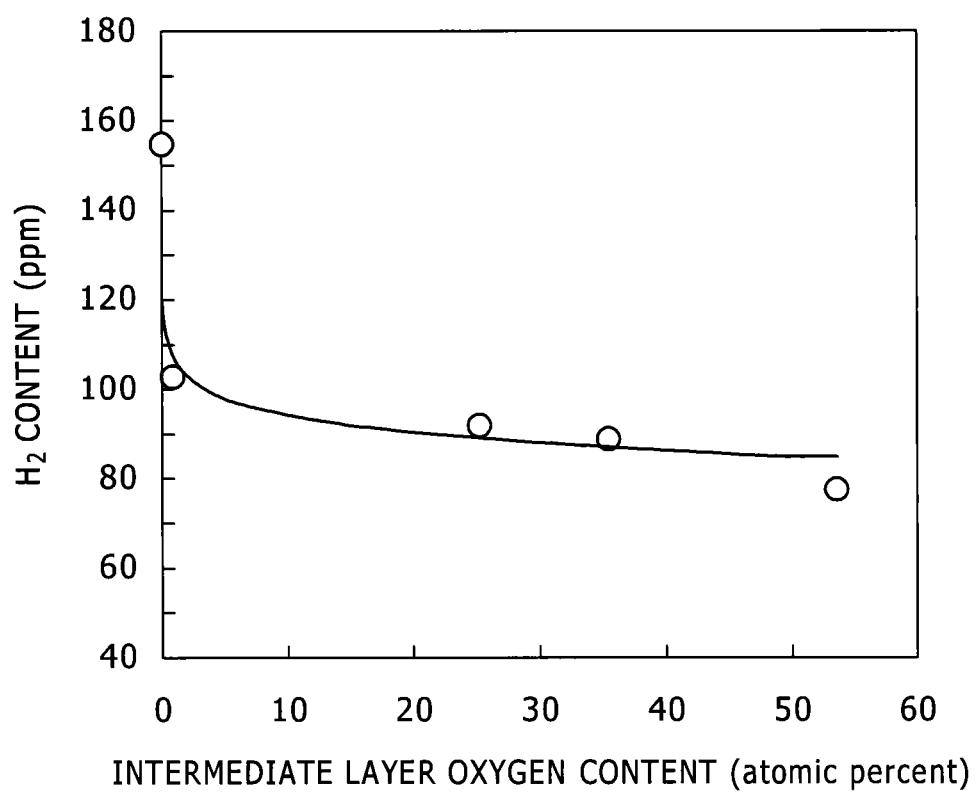
FIG. 4 is a graph illustrating how the hydrogen contents of fuel cell separator test samples after a hydrogen gas exposure test vary depending on the oxygen content in the intermediate layer, where the test samples were obtained in the experimental examples.

Each test sample was cut out to a size of 20 mm by 50 mm and placed in a gas phase of a well-closed container hermetically housing water and 0.3 MPa (3 atm) of hydrogen gas ($H_2$). This was heated at 150° C. to give a pure hydrogen atmosphere with a purity of 99.9% which had been humidified to humidity of about 100%. The test sample was exposed to the atmosphere for 500 hours as a hydrogen gas exposure test. After the test, the test sample was retrieved, placed in a graphite crucible, and heated and melted with tin in an inert gas (Ar) stream by a graphite resistance heating system to extract a gas. The gas extracted from the test sample was allowed to pass through a separation column to separate hydrogen ($H_2$) from other gases, the separated hydrogen gas was transferred to a thermal conductivity detector, and a change in thermal conductivity by hydrogen was measured. Thus, an average hydrogen ($H_2$) content (in ppm) in the test sample was measured by an inert gas melting-gas chromatography technique. Table 1 indicates the average $H_2$ contents of the test samples. FIG. 4 depicts a graph illustrating how the average $H_2$ content varies depending on the oxygen content in the intermediate layer. A titanium material may deteriorate in mechanical properties if having a $H_2$ content greater than 150 ppm. To prevent this, a sample having an average $H_2$ content of 150 ppm or less was accepted for resistance to hydrogen absorption.

the anticorrosion test, had sufficient conductivity and durability against a corrosive atmosphere, and satisfactorily resisted hydrogen absorption. In contrast, the test sample No. 1 had an insufficient oxygen content in the intermediate layer and failed to sufficiently resist hydrogen absorption although having excellent conductivity and durability against a corrosive atmosphere. This test sample was therefore unsuitable as a fuel cell separator to face an anode (fuel electrode) of a fuel cell. To the contrary, the test sample No. 5 had an excessively high oxygen content in the intermediate layer, had poor initial contact resistance, (high initial contact resistance value) and offered further inferior contact resistance (higher contact resistance value) after the anticorrosion test, although having excellent resistance to hydrogen absorption. This test sample was unsuitable as a fuel cell separator.

LIST OF REFERENCE SIGNS 10 fuel cell separator
1 substrate
2 carbon layer
3 intermediate layer

The invention claimed is:

1. A fuel cell separator, comprising:
    a substrate comprising titanium or a titanium alloy;
    a conductive carbon layer covering a surface of the substrate, wherein the carbon layer is formed by compression-bonding of a carbon powder to the substrate by rolling; and
    an intermediate layer at an interface between the substrate and the carbon layer, wherein the intermediate layer comprises titanium carbide and has an oxygen content of 0.1 to 40 atomic percent.

2. The fuel cell separator according to claim 1, wherein the carbon layer comprises graphite.

3. The fuel cell separator according to claim 2, wherein the intermediate layer has an oxygen content of 0.5 to 30 atomic percent.

4. The fuel cell separator according to claim 2, wherein the carbon layer has a hexagonal crystal graphite structure.

5. The fuel cell separator according to claim 2, wherein the carbon layer has an amorphous structure comprising a graphite structure and a diamond structure.

6. The fuel cell separator according to claim 1, wherein the intermediate layer has an oxygen content of 0.5 to 30 atomic percent.

7. The fuel cell separator according to claim 1, wherein the substrate has a thickness of from 0.05 to 1.0 mm.

TABLE 1

| Test sample Category | Number | $O_2$ content (ppm) in heat treatment atmosphere | Intermediate layer Presence of TiC | Chemical composition (atomic percent) Ti | C | O | Contact resistance (mΩ·cm²) Initial | After test | $H_2$ content after exposure to $H_2$ |
|---|---|---|---|---|---|---|---|---|---|
| Comparative Example | 1 | ≤2 | o | 52.43 | 47.5 | 0.07 | 3.2 | 4.6 | 155 |
| Example | 2 | 10 | o | 53.9 | 45.3 | 0.8 | 3.5 | 5.2 | 103 |
| Example | 3 | 50 | o | 34.4 | 40.4 | 25.2 | 3.8 | 6.3 | 92 |
| Example | 4 | 100 | o | 40.7 | 23.9 | 35.4 | 7.8 | 12.3 | 89 |
| Comparative Example | 5 | 500 | o | 31.3 | 15.2 | 53.5 | 15.0 | 18.5 | 78 |

Table 1 indicates that the heat treatment allowed each test sample to include titanium carbide formed as an intermediate layer between the substrate and the carbon layer, and that the intermediate layer had an increasing oxygen content with an increasing $O_2$ content in the heat treatment atmosphere. FIG. 3 indicates that the resulting separators had an increasing contact resistance with an increasing oxygen content in the intermediate layer and tended to have significantly increasing contact resistance particularly at an oxygen content greater than about 30 atomic percent. In contrast, FIG. 4 indicates that the separators sharply gained resistance to hydrogen absorption at a trace level (0.8 atomic percent) of oxygen content in the intermediate layer and had rather gradually increasing resistance to hydrogen absorption (suppression of the average $H_2$ content) at an oxygen content greater than the level.

The test samples Nos. 2 to 4 were examples each having an oxygen content in the intermediate layer within the range specified in the present invention. These test samples had satisfactory contrast resistance both before (initial) and after 8. The fuel cell separator according to claim 1, wherein the carbon layer covers the surface of the substrate at an area percentage of 40% or more.

9. The fuel cell separator according to claim 1, wherein the intermediate layer covers the interface between the substrate and the carbon layer at an area percentage of 50% or more.

10. The fuel cell separator according to claim 1, wherein the intermediate layer has a thickness of from 10 to 500 nm.

11. A method for producing a fuel cell separator, the method comprising:
   compression-bonding a carbon powder to a substrate comprising titanium or a titanium alloy to form a conductive carbon layer over the substrate; and
   subjecting the substrate bearing the carbon layer a heat treatment in inert atmosphere comprising oxygen gas in a content of 5 to 300 ppm to form an intermediate layer between the substrate and the carbon layer,
   wherein the intermediate layer comprises titanium carbide and has an oxygen content of 0.1 to 40 atomic percent.

* * * * *